(12) United States Patent
Sakamoto (10) Patent No.: US 10,340,682 B2
(45) Date of Patent: Jul. 2, 2019

(54) ELECTRONIC DEVICE AND METHOD OF MANUFACTURING THE SAME

(71) Applicant: Murata Manufacturing Co., Ltd., Nagaokakyo-shi, Kyoto-fu (JP)

(72) Inventor: Hiroki Sakamoto, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/725,572

(22) Filed: Oct. 5, 2017

(65) Prior Publication Data

US 2018/0041026 A1 Feb. 8, 2018

Related U.S. Application Data

(63) Continuation of application No. PCT/JP2016/062677, filed on Apr. 21, 2016.

(30) Foreign Application Priority Data

Apr. 22, 2015 (JP) .................. 2015-087425

(51) Int. Cl.
*H02H 7/16* (2006.01)
*H05K 1/18* (2006.01)
(Continued)

(52) U.S. Cl.
CPC ............. *H02H 7/16* (2013.01); *H01G 2/06* (2013.01); *H01G 4/002* (2013.01); *H01G 4/258* (2013.01);
(Continued)

(58) Field of Classification Search
CPC ............ H02H 7/16; H01G 2/06; H01G 4/002; H01G 4/258; H01G 4/40; H01G 4/248;
(Continued)

(56) References Cited

U.S. PATENT DOCUMENTS

| 5,859,407 A | 1/1999 | Saiki et al. |
| 6,448,506 B1 * | 9/2002 | Glenn ................. H01L 23/3128 174/260 |

(Continued)

FOREIGN PATENT DOCUMENTS

| JP | S53-109058 U | 9/1978 |
| JP | H08-18285 A | 1/1996 |

(Continued)

OTHER PUBLICATIONS

International Search Report issued in International Application No. PCT/JP2016/062677, dated Jul. 12, 2016.

(Continued)

*Primary Examiner* — Zeev V Kitov
(74) *Attorney, Agent, or Firm* — Arent Fox LLP (57) ABSTRACT

An electronic-device having an intermediate connection layer interposed between a wiring substrate and an electronic component. The intermediate connection layer has a laminated structure including a rigid substrate and a flexible substrate. A first conductor part is formed on one principal surface of the flexible substrate, and second and third conductor parts are formed on both principal surfaces of the rigid substrate, respectively. The rigid substrate includes an opening, and the first conductor part of the flexible substrate includes a narrowed fuse part at a position opposite the opening. Windows are formed near the fuse part. The flexible substrate and the rigid substrate are electrically connected with each other via solder.

14 Claims, 10 Drawing Sheets

(51) Int. Cl.
*H01G 4/002* (2006.01)
*H05K 3/46* (2006.01)
*H01G 4/258* (2006.01)
*H05K 3/40* (2006.01)
*H05K 3/34* (2006.01)
*H01G 2/06* (2006.01)
*H05K 1/02* (2006.01)
*H01G 4/40* (2006.01)
*H05K 1/11* (2006.01)
*H01G 4/248* (2006.01)
*H01G 4/30* (2006.01)

(52) U.S. Cl.
CPC ............... *H01G 4/40* (2013.01); *H05K 1/02* (2013.01); *H05K 1/111* (2013.01); *H05K 1/115* (2013.01); *H05K 1/18* (2013.01); *H05K 1/181* (2013.01); *H05K 3/341* (2013.01); *H05K 3/4053* (2013.01); *H05K 3/4611* (2013.01); *H01G 4/248* (2013.01); *H01G 4/30* (2013.01); *H05K 2201/10015* (2013.01); *H05K 2201/10181* (2013.01); *H05K 2201/10378* (2013.01); *H05K 2201/10636* (2013.01)

(58) Field of Classification Search
CPC .......... H05K 1/02; H05K 1/111; H05K 1/115; H05K 1/18; H05K 1/181; H05K 3/341; H05K 3/4053; H05K 3/4611; H05K 2201/10015; H05K 2201/10181; H05K 2201/10378; H05K 2201/10636
See application file for complete search history.

(56) References Cited

U.S. PATENT DOCUMENTS 7,436,284 B2  10/2008  Bender et al.
2004/0184211 A1  9/2004  Bender et al.

FOREIGN PATENT DOCUMENTS

| JP | 3038644 B2 | 5/2000 |
| JP | 2003-158225 A | 5/2003 |
| JP | 2005-243621 A | 9/2005 |
| JP | 2010-73805 A | 4/2010 |
| JP | 2013-168536 A | 8/2013 |

OTHER PUBLICATIONS

Written Opinion of the International Searching Authority issued in International Application No. PCT/JP2016/062677, dated Jul. 12, 2016.

* cited by examiner

ELECTRONIC DEVICE AND METHOD OF MANUFACTURING THE SAME

CROSS REFERENCE TO RELATED APPLICATIONS

The present application is a continuation of International application No. PCT/JP2016/062677, filed Apr. 21, 2016, which claims priority to Japanese Patent Application No. 2015-087425, filed Apr. 22, 2015, the entire contents of each of which are incorporated herein by reference.

FIELD OF THE INVENTION

The present invention relates to an electronic device and a method of manufacturing the same, and more specifically relates to an electronic device in which an electronic component such as a chip-type multilayer ceramic capacitor is mounted on a substrate, and a method of manufacturing the same.

BACKGROUND OF THE INVENTION

Conventionally, a surface mounting technology of mounting an electronic component such as a chip-type multilayer ceramic capacitor on a substrate has been widely known. Such a surface mounting technology includes a technology researched and developed to achieve a fuse function to prevent, for example, burnout and firing of the mounting substrate when large current flows through the mounted electronic component.

Figure 11:
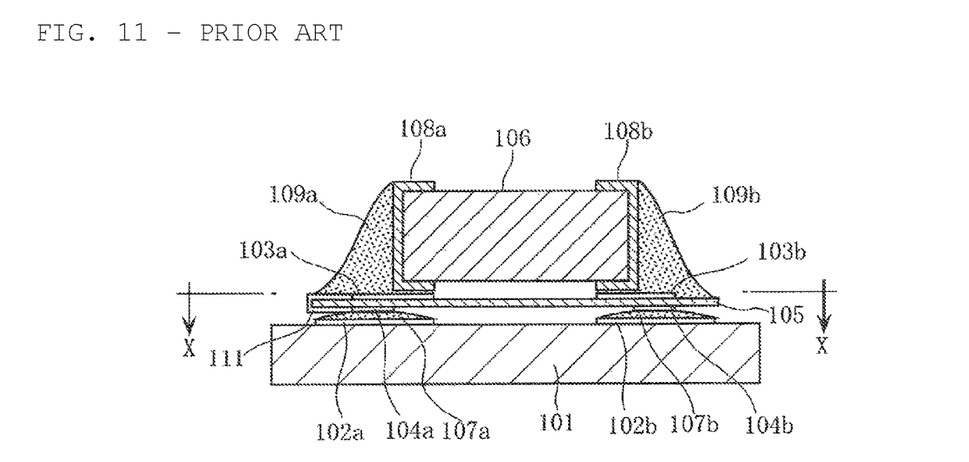
FIG. 11 is a cross-sectional view of a mounting device for a surface-mounted component disclosed in Patent Document 1.

For example, Patent Document 1 discloses a mounting device for a surface-mounted component as illustrated in FIG. 11.

This mounting device includes a surface-mounted wiring board 101, first land electrodes 102a and 102b provided on an upper surface of the surface-mounted wiring board 101, an intermediate connection layer 105, on upper and lower surfaces of which second land electrodes 103a and 103b and third land electrodes 104a and 104b are respectively provided, and a surface-mounted component 106. The first land electrodes 102a and 102b are electrically connected with the third land electrodes 104a and 104b through solder 107a and 107b, respectively, and the second land electrodes 103a and 103b are electrically connected with external electrodes 108a and 108b of the surface-mounted component 106, respectively, through solder 109a and 109b.

Figure 12:
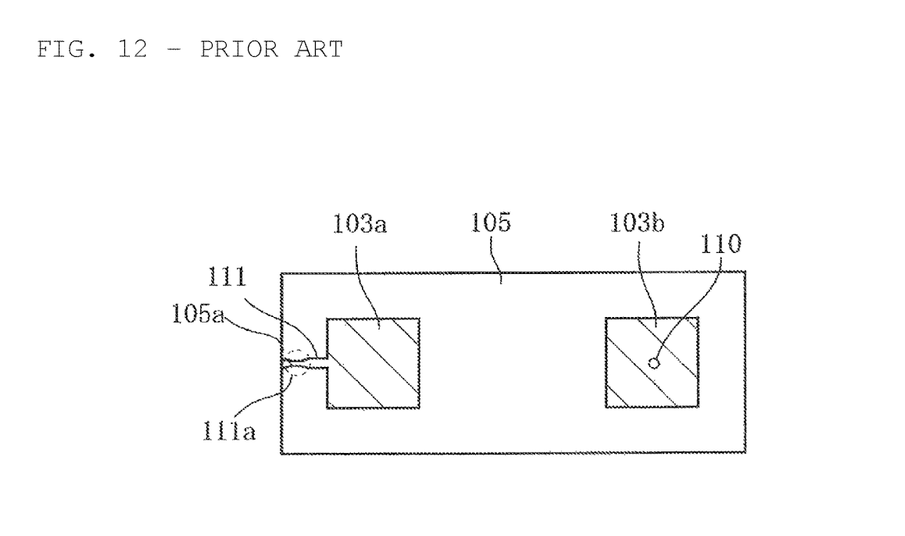
FIG. 12 is a view in the direction indicated by arrows X-X in FIG. 11.

FIG. 12 is a view in the direction indicated by arrows X-X in FIG. 11.

Specifically, in the device disclosed in Patent Document 1, the intermediate connection layer 105 includes a conducting via 110 electrically connecting the second land electrode 103b and the third land electrode 104b, and the first land electrode 102b of the surface-mounted wiring board 101 is electrically connected with the external electrode 108b of the surface-mounted component 106 through the conducting via 110. In the device disclosed in Patent Document 1, a conductive pattern 111 having a thin line structure including a fuse 111a is formed on the intermediate connection layer 105 and suspended at an one end part 105a, and the second land electrode 103a is electrically connected with the third land electrode 104a through the conductive pattern 111, and accordingly, the land electrode 102a of the surface-mounted wiring board 101 is electrically connected with the external electrode 108a of the surface-mounted component 106.

In the device disclosed in Patent Document 1, since an intermediate connection layer having a fuse function is interposed between an electronic component and a mounting substrate, the fuse function achieves an open circuit when large current equal to or larger than rated current flows through the mounted electronic component and damages the electronic component, and accordingly, influence on any peripheral mounting component is minimized to prevent, for example, burnout and firing of the mounting substrate.

Figure 13:
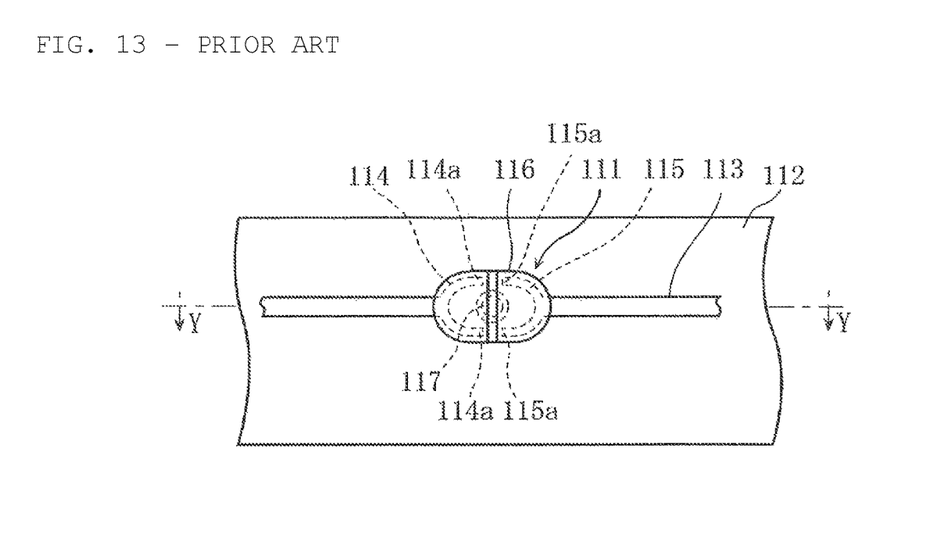
FIG. 13 is a plan view of a circuit board disclosed in Patent Document 2.

Patent Document 2 discloses a circuit board as illustrated in FIG. 13.

In the circuit board disclosed in Patent Document 2, a circuit protecting device 111 includes breaking parts 114a and 115a configured to prevent conduction of conductor end parts 114 and 115 of a conductor pattern 113 formed on a principal surface of a circuit board 112 made of an insulation resin material such as glass epoxy resin, and a conductor member 116 is bridged between the conductor end parts 114 and 115.

Figure 14:
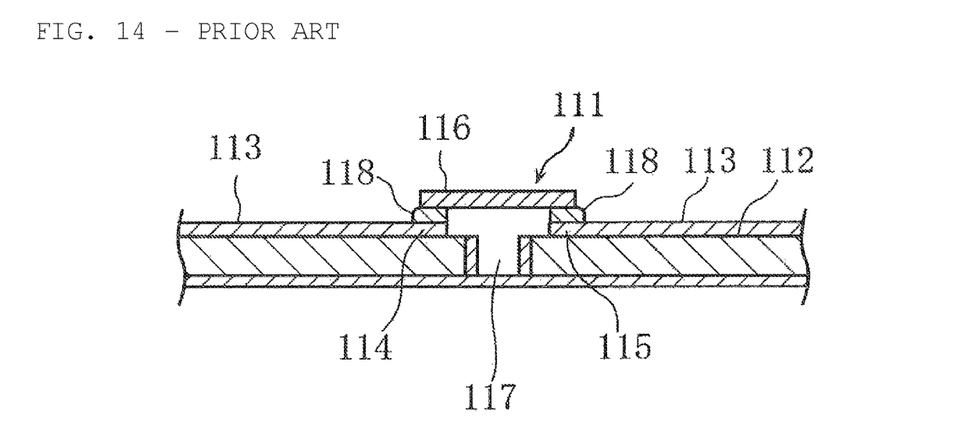
FIG. 14 is a cross-sectional view in the direction indicated by arrows Y-Y in FIG. 13.

FIG. 14 is a cross-sectional view in the direction indicated by arrows Y-Y in FIG. 13.

In the circuit board disclosed in Patent Document 2, soldering paste is applied on the conductor end parts 114 and 115 to form a solder part 118, and soldering paste having a melting point higher than that for the solder part 118 is applied to form the conductor member 116 having a fuse function.

In the circuit board disclosed in Patent Document 2, for example, when eddy current flows through an earth wire, heat is generated at the conductor pattern 113, the solder part 118, and the conductor member 116 and melts the conductor member 116 to allow the soldering paste of the conductor member 116 to flow into a hole 117. This opens the conductor end parts 114 and 115 and puts a circuit in a non-conduction state, and accordingly, prevents damage on the circuit due to the eddy current flowing thereto.

Patent Document 1: Japanese Patent Application Laid-open No. 8-18285 (claims 4 and 5, paragraphs [0011] and [0014], and FIGS. 1 and 6, for example)

Patent Document 2: Japanese Patent Application Laid-open No. 2010-73805 (claim 1, paragraphs [0012] to [0022], and FIG. 2, for example)

SUMMARY OF THE INVENTION

In the device disclosed in Patent Document 1 (FIGS. 11 and 12), the fuse 111a is suspended at the one end part 105a of the intermediate connection layer 105 outside the surface-mounted component 106. This configuration reduces a region in which the fuse 111a is formed, and limits the length of the fuse 111a. In other words, it is difficult to provide a sufficient length of the fuse 111a, and thus current cannot be cut off due to arc discharge despite of meltdown of the fuse 111a, which potentially prevents the fuse 111a from achieving the fuse function.

To provide a sufficient length of the fuse 111a, a large fuse formation region needs to be provided outside the intermediate connection layer 105. To achieve this, the intermediate connection layer 105 needs to have increased dimensions in longitudinal and width directions, causing increase in the size of the device, which is thus not preferable.

In the circuit board disclosed in Patent Document 2 (FIGS. 13 and 14), an bridging process using soldering paste is needed to produce the conductor member 116 having a fuse function, which complicates a manufacturing process. Moreover, since the conductor member 116 is formed by bridging, it is difficult to form a narrow and short fuse part. In addition, since the conductor member 116 having a fuse function is connected with the conductor pattern 113 through the solder part 118, for example, variation in solder wettability to the conductor member 116 potentially causes variation in the shape and meltdown characteristic of a fuse.

The present invention is intended to solve the above-described problems by providing an electronic device that can provide a desired fuse function having a favorable meltdown characteristic at low cost and have favorable reliability without involving increase in the size of the device, and a method of manufacturing the electronic device.

To achieve the above-described intention, an electronic device according to the present invention includes a wiring substrate including a land electrode, and an electronic component electrically connected to the wiring substrate with an intermediate connection layer interposed therebetween. The intermediate connection layer has a laminated structure including a rigid substrate mainly made of a rigid material and a flexible substrate mainly made of a flexible material, a first conductor part is formed on one principal surface of the flexible substrate, and second and third conductor parts are formed on respective principal surfaces of the rigid substrate. The rigid substrate includes an opening therein. The first conductor part of the flexible substrate includes a narrowed fuse part at a position opposite to the opening. The flexible substrate and the rigid substrate are electrically connected with each through a conductive bond material.

With this configuration, when current equal to or larger than rated current flows through the electronic component, the fuse part melts down to achieve an open circuit, and heat conduction from the fuse part to the rigid substrate at meltdown can be reduced since the fuse part is formed at a position opposite the opening of the rigid substrate. Accordingly, a meltdown time can be reduced, and firing of the intermediate connection layer can be prevented.

In the electronic device according to the present invention, it is preferable that the first to third conductor parts each include a plurality of connection electrodes electrically insulated from each other.

In the electronic device according to the present invention, it is preferable that the flexible substrate includes a window located near the fuse part.

In the electronic device according to the present invention, it is preferable that the flexible substrate includes a through-hole in the first conductor part and filled with the conductive bond material, and the electronic component is joined with the flexible substrate and simultaneously the flexible substrate is joined with the rigid substrate.

With this configuration, an electronic device having favorable electric conduction and favorable reliability can be obtained at low cost.

In the electronic device according to the present invention, it is preferable that a metal film is formed on a side surface of the intermediate connection layer.

With this configuration, the junction of a substrate and the intermediate connection layer spreads toward the bottom, thereby easily forming a favorable fillet and obtaining a favorable completed state.

In the electronic device according to the present invention, it is preferable that the flexible substrate is mainly made of a thermally resistant resin material.

In this case, the thermal resistance of the flexible substrate can effectively prevent, for example, firing, smoking, and burnout of the intermediate connection layer.

In the electronic device according to the present invention, it is preferable that the flexible substrate is thinner than the rigid substrate.

In the electronic device according to the present invention, it is preferable that the conductive bond material is a soldering material.

In the electronic device according to the present invention, it is preferable that the electronic component is disposed opposite the flexible substrate.

With this configuration, heat is unlikely to transfer to the substrate when the fuse part melts down, which allows further effective reduction of damage on the substrate when large current flows through and damages the electronic component.

An electronic-device manufacturing method according to the present invention includes: preparing a rigid base mainly made of a rigid material and a flexible base mainly made of a flexible material; forming a first conductive part including a narrowed fuse on one principal surface of the flexible base, and forming a through-hole inside the first conductive part; forming second and third conductive parts on both principal surfaces of the rigid base and forming an opening in the rigid base; laminating the flexible substrate and the rigid substrate so that the fuse part is disposed opposite the opening, and then applying conductive bond material to the through-hole; and heating an electronic component placed on the flexible substrate to join the electronic component with the flexible substrate and simultaneously join the flexible substrate with the rigid substrate.

In this manner, the flexible substrate and the rigid substrate are separately produced and then joined together simultaneously with mounting of the electronic component. This eliminates the need to produce the intermediate connection layer from an expensive rigid flexible base, which allows manufacturing of an electronic device having a desired fuse function at low cost. In addition, since the conductive bond is applied to the through-hole to achieve electric conduction inside the intermediate connection layer through the conductive bond, the occurrence of a breaking defect when a heat load is repeatedly applied in a constant cycle can be reduced unlike a case in which electric conduction is achieved through, for example, a conducting via formed by plating, which allows manufacturing of an electronic device having favorable reliability.

In the electronic-device manufacturing method according to the present invention, it is preferable that the conductive bond material is applied to the through-hole by a printing method.

In this manner, when the conductive bond is applied to the through-hole by a printing method such as screen printing, the through-hole can be filled further uniformly and entirely with the conductive bond as compared to a case in which a via is filled with a metallic material by plating.

In the electronic-device manufacturing method according to the present invention, it is preferable that the intermediate connection layer including the flexible substrate and the rigid substrate thus joined is placed on the substrate and mounted on the substrate by heating with application of the conductive bond material.

In the electronic-device manufacturing method according to the present invention, it is preferable that the conductive bond material is made of a soldering material.

With the electronic device according to the present invention, when large current equal to or larger than rated current flows through the mounted electronic component and damages the electronic component, the fuse part melts down to achieve an open circuit, and heat conduction from the fuse part to the rigid substrate at meltdown can be reduced since the fuse part is formed at a position opposite the opening of the rigid substrate. Accordingly, a meltdown time can be reduced and firing of the intermediate connection layer can be prevented.

Moreover, it is unnecessary to bridge a conductor member as disclosed in Patent Document 2, which allows formation of a narrow and short fuse part.

In addition, since the fuse part is formed on the flexible substrate, no fuse needs to be attached through, for example, solder, which leads to reduction of meltdown characteristic variation without influence of, for example, solder wettability.

With the electronic-device manufacturing method according to the present invention, the flexible substrate and the rigid substrate are separately produced and then joined together simultaneously with mounting of the electronic component. This eliminates the need to produce the intermediate connection layer from an expensive rigid flexible base, which allows manufacturing of an electronic device having a desired fuse function at low cost. In addition, since the conductive bond is applied to the through-hole to achieve electric conduction inside the intermediate connection layer through the conductive bond, the occurrence of a breaking defect when a heat load is repeatedly applied in a constant cycle can be reduced as compared to a case in which a conducting via as disclosed in Patent Document 1 is produced by plating, which allows manufacturing of an electronic device having favorable reliability.

BRIEF EXPLANATION OF THE DRAWINGS

FIGS. 8(*a*) and 8(*b*) are each a perspective view (1/3) illustrating one embodiment of a manufacturing process of the above-described manufacturing method.

FIGS. 9(*a*) and 9(*b*) are each a perspective view (2/3) illustrating the one embodiment of the manufacturing process of the above-described manufacturing method.

FIGS. 10(*a*) and 10(*b*) are each a perspective view (3/3) illustrating the one embodiment of the manufacturing process of the above-described manufacturing method.

DETAILED DESCRIPTION OF THE INVENTION

Embodiments of the present invention will be described in detail below with reference to the accompanying drawings.

Figure 1:
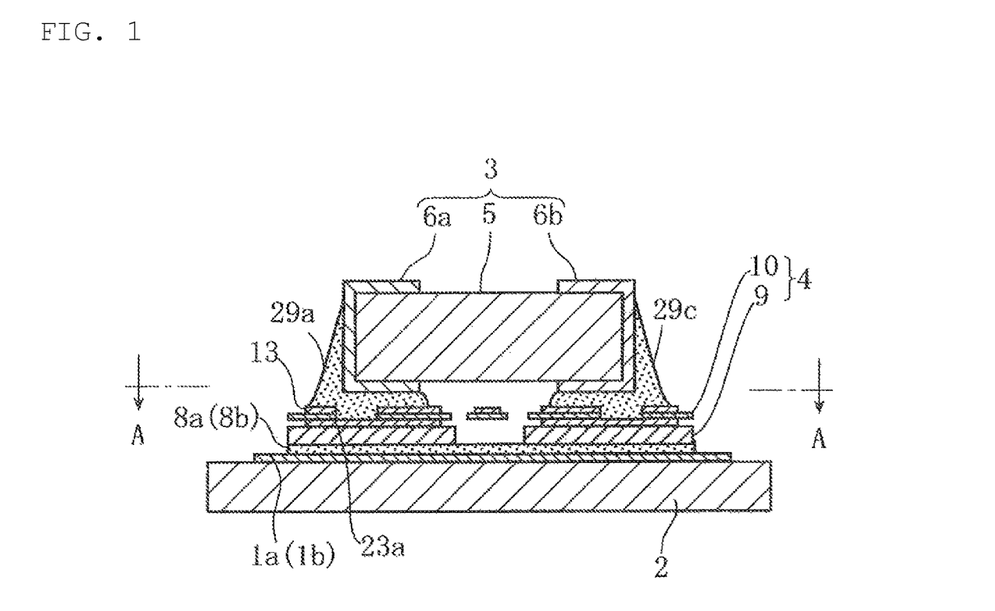
FIG. 1 is a longitudinal sectional view illustrating one embodiment of an electronic device according to the present invention.
Figure 2:
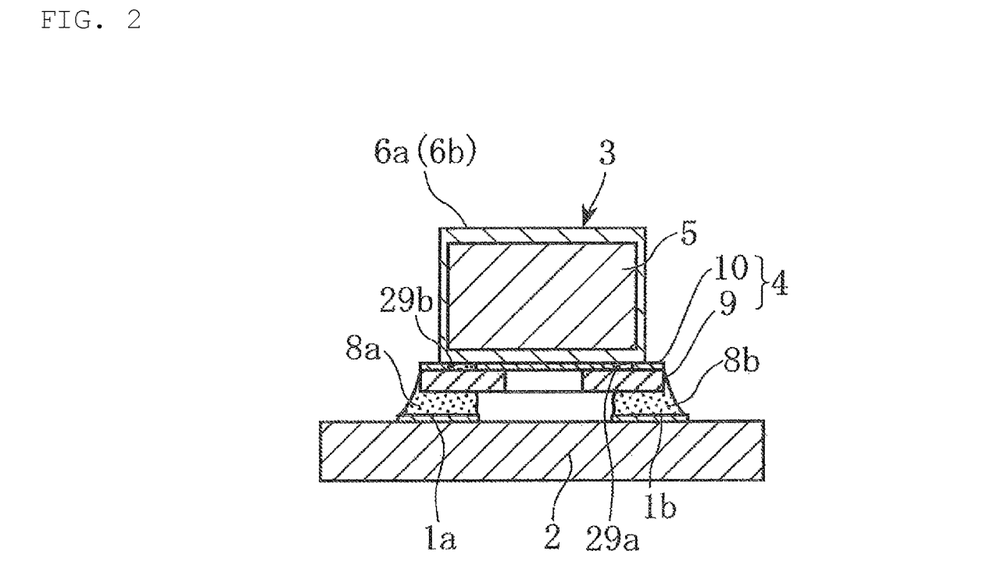
FIG. 2 is a transverse sectional view of FIG. 1.

FIG. 1 is a longitudinal sectional view schematically illustrating one embodiment of an electronic device according to the present invention, and FIG. 2 is a transverse sectional view of FIG. 1.

This electronic device includes a wiring substrate 2, on an upper surface of which first and second land electrodes 1*a* and 1*b* are formed, and an electronic component 3, such as a chip-type multilayer ceramic capacitor, mainly made of a ceramic material. An intermediate connection layer 4 is interposed between the wiring substrate 2 and the electronic component 3. Specifically, the electronic component 3 is mounted on the intermediate connection layer 4, and the intermediate connection layer 4, on which the electronic component 3 is mounted, is mounted on the wiring substrate 2.

Specifically, the electronic component 3 includes first and second external electrodes 6*a* and 6*b* respectively formed at both end parts of a component body 5 made of a ceramic material. The first and second external electrodes 6*a* and 6*b* are electrically connected through a first conductor part, the first conductor part being formed on an upper surface of the intermediate connection layer 4. The first and second land electrodes 1*a* and 1*b* formed on the upper surface of the wiring substrate 2 are electrically connected with a third conductor part with solder 8*a* and 8*b* interposed therebetween, the third conductor part being formed on a lower surface of the intermediate connection layer 4.

The intermediate connection layer 4 has a laminated structure including a rigid substrate 9 mainly made of a rigid material and a thin flexible substrate 10 mainly made of a flexible material, and in the present embodiment, the flexible substrate 10 is laminated on the rigid substrate 9.

Figure 3:
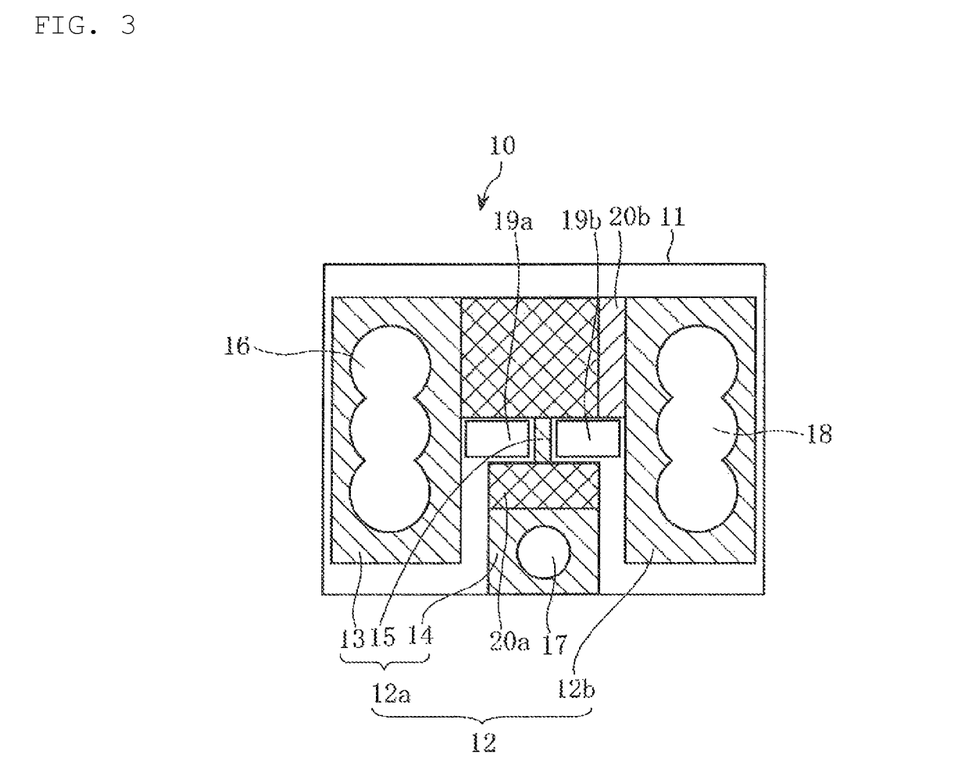
FIG. 3 is a plan view illustrating one embodiment of a flexible substrate.

FIG. 3 is a plan view of the flexible substrate 10.

The flexible substrate 10 includes first and second connection electrodes 12*a* and 12*b* formed on an upper surface (one principal surface) of a flexible base 11 and the first and second connection electrodes 12*a* and 12*b* serve as the first conductor part 12.

The first connection electrode 12*a* includes a main conductor part 13 formed in a substantially L shape including a region opposite a first external electrode 6*a*, a sub-conductor part 14 formed opposite the main conductor part 13 at a substantially central side part of the principal surface of the flexible base 11, and a fuse part 15 formed in a narrowed shape connecting the main conductor part 13 and the sub-conductor part 14.

The first connection electrode 12*a* includes a first through-hole 16 formed inside the main conductor part 13, and a second through-hole 17 formed inside the sub-conductor part 14.

The second connection electrode 12*b* is formed in a region opposite the second external electrode 6*b*. The second connection electrode 12*b* includes a third through-hole 18 formed inside.

A pair of windows 19*a* and 19*b* is formed near both sides of the fuse part 15.

Protective films 20*a* and 20*b* made of, for example, a solder resist are formed on the upper surface of the flexible base 11 to prevent electric contact between the first connection electrode 12*a* and the second connection electrode 12*b* through solder to be described later.

A substrate material used for the flexible substrate 10, which is the flexible base 11, is not limited to a particular material as long as the material is mainly made of a flexible material, but typically, is mainly made of a polyimide resin having favorable thermal resistance. When large current flows through and damages the electronic component 3, the flexible substrate 10 having thermal resistance can prevent firing, smoking, and burnout of the intermediate connection layer 4, and hence prevent failure of the wiring substrate 2.

Figure 4:
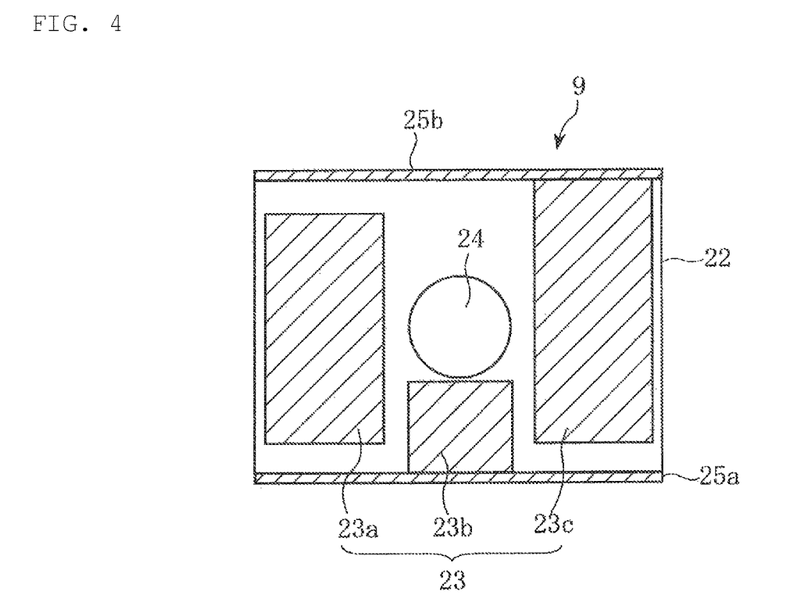
FIG. 4 is a plan view illustrating one embodiment of a rigid substrate.

FIG. 4 is a plan view of the rigid substrate 9.

The rigid substrate 9 includes a third connection electrode 23a formed in a region of an upper surface of a rigid base 22 opposite the main conductor part 13 of the first connection electrode 12a, and a fourth connection electrode 23b formed in a region opposite the sub-conductor part 14. The rigid substrate 9 also includes a fifth connection electrode 23c formed in a region opposite the second connection electrode 12b. The third to fifth connection electrodes 23a to 23c serve as a second conductor part 23.

An opening 24 is provided substantially at the center of the rigid base 22. Metal films 25a and 25b are formed on side surfaces of the rigid base 22.

A metallic material used for the metal films 25a and 25b is not limited to a particular material, but typically is a metallic material identical to those of the first and second conductor parts 12 and 23 and the third conductor part 26 to be described later. For example, when the first to third conductor parts 12, 23, and 26 are made of Cu, typically, the metal films 25a and 25b are made of Cu.

Figure 5:
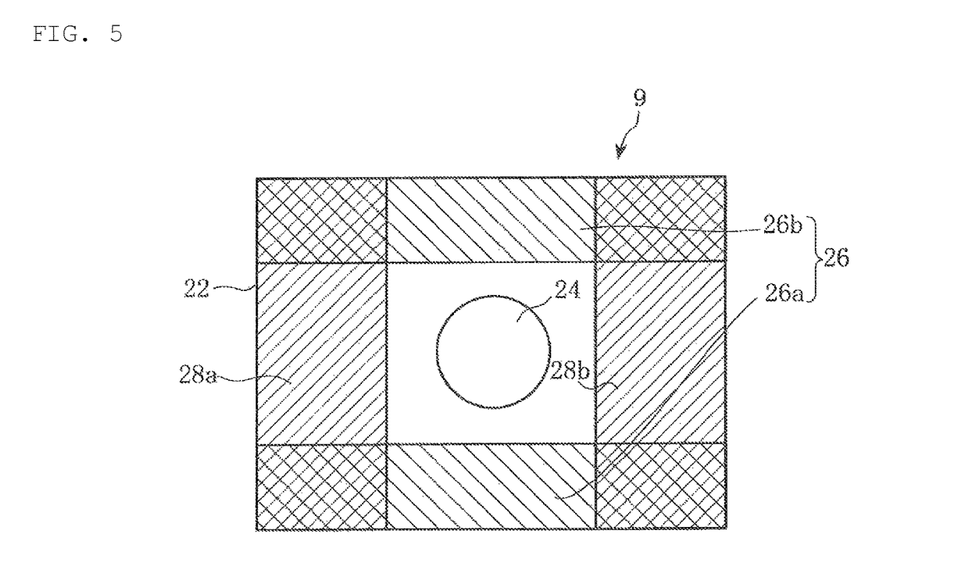
FIG. 5 is a bottom view illustrating the one embodiment of the rigid substrate.

FIG. 5 is a bottom view of the rigid substrate 9.

A sixth connection electrode 26a and a seventh connection electrode 26b are formed on a lower surface of the rigid base 22 along side surfaces of the rigid base 22. Protective films 28a and 28b made of, for example, a solder resist are formed on the lower surface of the rigid base 22 along end faces of the rigid base 22 to prevent contact between the sixth connection electrode 26a and the seventh connection electrode 26b through solder. The sixth and seventh connection electrodes 26a and 26b serve as the third conductor part 26.

A substrate material used for the rigid substrate 9, which is the rigid base 22, is not limited to a particular material as long as the material is mainly made of a rigid material, but typically is glass epoxy resin.

Figure 6:
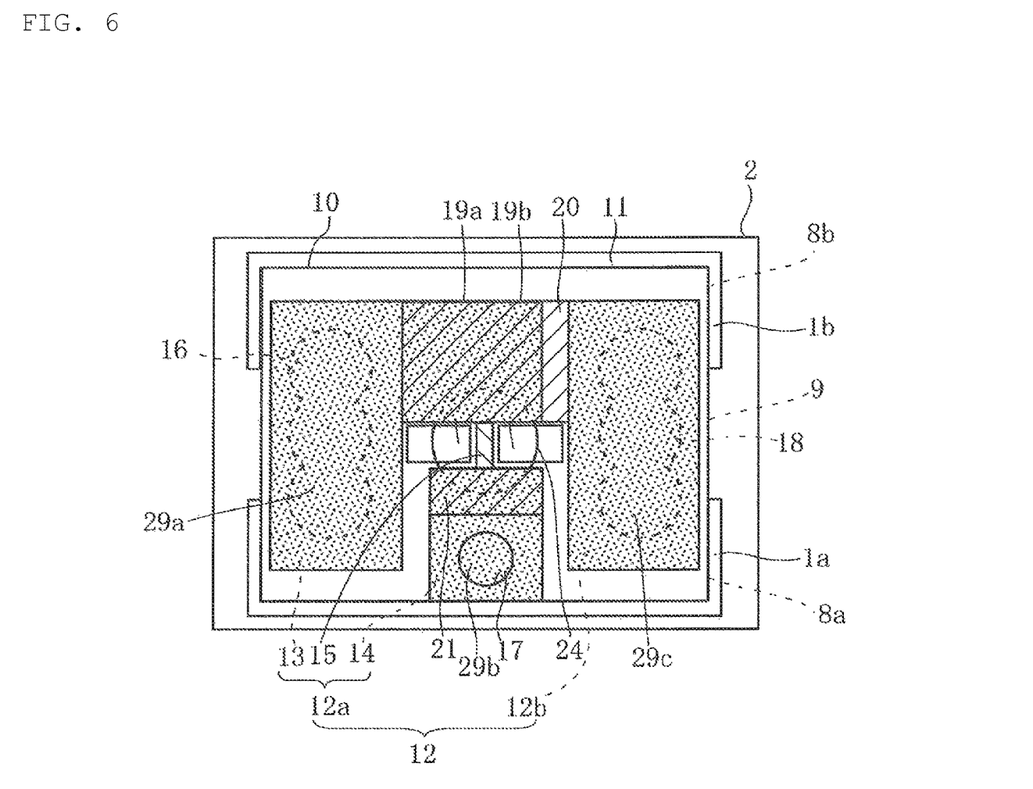
FIG. 6 is a view in the direction indicated by arrows A-A in FIG. 1.

FIG. 6 is a view in the direction indicated by arrows A-A in FIG. 1.

The first to third through-holes 16 to 18 of the flexible substrate 10 are filled with the solder 29a to 29c as conductive bond, and upper surfaces of the first and second connection electrodes 12a and 12b are covered by the solder 29a to 29c. The flexible substrate 10 and the rigid substrate 9 have respective surfaces electrically connected with each other through the solder 29a to 29c.

In the electronic device thus formed, the first and second external electrodes 6a and 6b of the electronic component 3 are electrically connected with the main conductor part 13 and the second connection electrode 12b of the flexible substrate 10 and also with the third and fifth connection electrodes 23a and 23c of the rigid substrate 9 through the respective solder 29a and 29c. The electronic component 3 is thus mounted on the intermediate connection layer 4.

The sub-conductor part 14 of the flexible substrate 10 is connected with the fourth connection electrode 23b of the rigid substrate 9 through the solder 29b, and also with the sixth connection electrode 26a through the metal film 25a.

The second connection electrode 12b of the flexible substrate 10 is connected with the fifth connection electrode 23c of the rigid substrate 9 through the solder 29c, and also with the seventh connection electrode 26b through the metal film 25b.

The sixth and seventh connection electrodes 26a and 26b are connected with the first and second land electrodes 1a and 1b of the wiring substrate 2 by soldering, and accordingly, the intermediate connection layer 4 is mounted on the wiring substrate 2.

In the electronic device thus configured, when large current equal to or larger than rated current flows through the mounted electronic component 3 and damages the electronic component 3, the fuse part 15 melts down to achieve an open circuit. Moreover, since the fuse part 15 is formed at a position opposite the opening 24 of the rigid substrate 9, heat conduction from the fuse part 15 to the rigid substrate 9 at the meltdown can be suppressed, which leads to a reduced meltdown time and prevention of firing of the intermediate connection layer 4.

Moreover, it is unnecessary to bridge a conductor member as disclosed in Patent Document 2, which allows formation of a narrow and short fuse part.

In addition, since the fuse part 15 is formed on the flexible substrate 10, no fuse needs to be attached through, for example, solder, which leads to reduction of meltdown characteristic variation without influence of, for example, solder wettability.

Since the flexible substrate 10 is made of a thin material having a desirable thermal resistance, such as a polyimide resin, firing, smoking, burnout, and the like of the wiring substrate 2 when the fuse part 15 melts down and generates heat can be effectively prevented.

In particular, since the electronic component 3 is disposed opposite the flexible substrate 10, heat is unlikely to be transferred to the wiring substrate 2 when the fuse part 15 melts down, thereby further effectively reducing damage on the wiring substrate 2 even when the large current is flowing through and damaging the electronic component 3.

In addition, since the metal films 25a and 25b are formed at end faces of the intermediate connection layer 4, the junction of the wiring substrate 2 and the intermediate connection layer 4 spreads toward the bottom at soldering, thereby easily forming a favorable fillet and obtaining a favorable completed state.

The following describes a method of manufacturing the above-described electronic device in detail.

In terms of productivity and the like, such an electronic device is produced by a multipiece scheme which can efficiently obtaining a large number of electronic devices by mounting the large number of electronic components on a large-sized substrate and cutting the large-sized substrate in longitudinal and transverse directions into individual pieces.

Thus, the present embodiment describes a method of obtaining electronic devices by the multipiece scheme.

Figure 7:
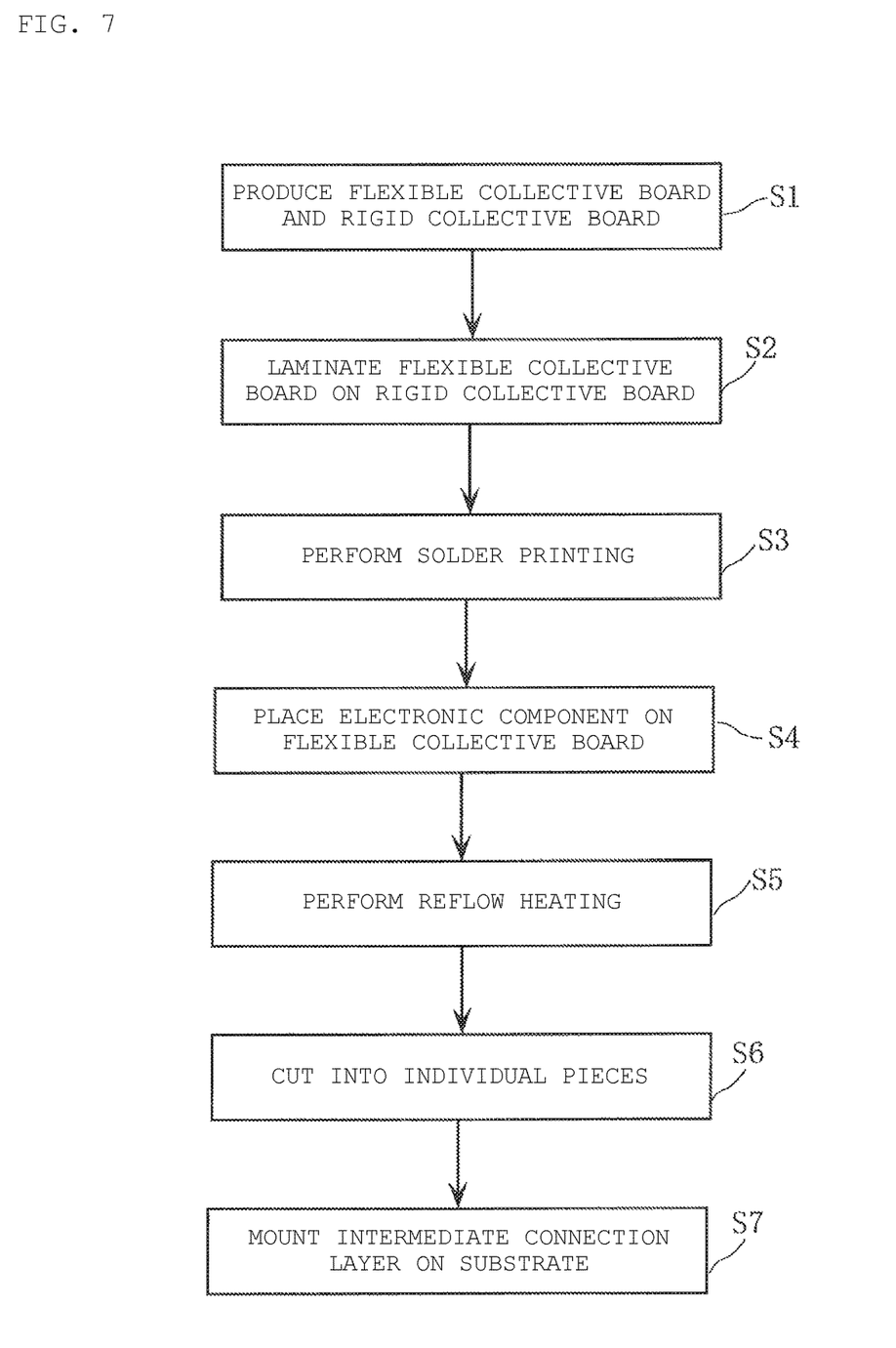
FIG. 7 is a flowchart illustrating the one embodiment of the electronic-device manufacturing method according to the present invention.

FIG. 7 is a flowchart illustrating a manufacturing process of the electronic-device manufacturing method.

First, at step S1, a flexible collective board that is an assembly of flexible substrates, and a rigid collective board that is an assembly of rigid substrates are separately produced.

Specifically, the flexible collective board can be produced by a method described below.

First, a large-sized flexible base made of, for example, a polyimide resin is prepared. The thickness of the flexible base is not particularly limited but is preferably as thin as possible, for example, 12.5 μm to 25 μm to suppress the heat diffusion of the flexible substrate 10 divided into an individual piece and facilitate meltdown of the fuse part 15.

Then, a publicly known photolithography technique is applied to the large-sized flexible base to produce a matrix of a plurality of the first conductor parts 12 each including as a pair of the first and second connection electrodes 12a and 12b. Then, the first to third through-holes 16 to 18 are produced inside the first and second connection electrodes 12a and 12b by using a piercing machine such as a drill, and in addition, a pair of the windows 19a and 19b are produced at predetermined places through irradiation with laser light. Thereafter, the protective layers 20a and 20b are formed by applying and drying, for example, solder resists at predetermined places to prevent electric contact between the first connection electrode 12a and the second connection electrode 12b due to unnecessary spread of a region in which solder as conductive bond is applied, which completes the production of the flexible collective board.

The rigid collective board can be produced by a method described below.

First, a large-sized rigid base mainly made of a resin material such as glass epoxy resin with a metal thin film such as Cu formed on upper and lower surfaces is prepared. The thickness of the rigid base is not particularly limited, but a rigid base having a thickness of, for example, 0.2 mm to 1.0 mm approximately can be used.

Then, slit openings (hereinafter referred to as "film formation sites") are formed at sites at which the metal films 25a and 25b are to be formed, by fabricating predetermined parts of the large-sized rigid base with a grinding tool such as a grinder. Subsequently, a publicly known photolithography technique is applied to produce, on the upper surface of the rigid base, a matrix of a plurality of the second conductor parts 23 each including a set of the third to fifth connection electrodes 23a to 23c, and to produce, on the lower surface of the rigid base 22, a matrix of a plurality of the third conductor parts 26 each including a pair of the sixth and seventh connection electrodes 26a and 26b. Then, the opening 24 is formed at a predetermined place of the large-sized rigid base by using a piercing machine such as a drill. Then, the film formation sites are provided with plating such as electrolytic plating or non-electrolytic plating to fill the film formation sites, which are to be the metal films 25a and 25b, with a metallic material such as Cu. Thereafter, the protective layers 28a and 28b are formed by applying and drying, for example, solder resists at predetermined places to prevent electric contact between the sixth connection electrode 26a and the seventh connection electrode 26b due to unnecessary spread of a region in which solder as conductive bond is applied, which completes the production of the rigid collective board.

Figure 8A:
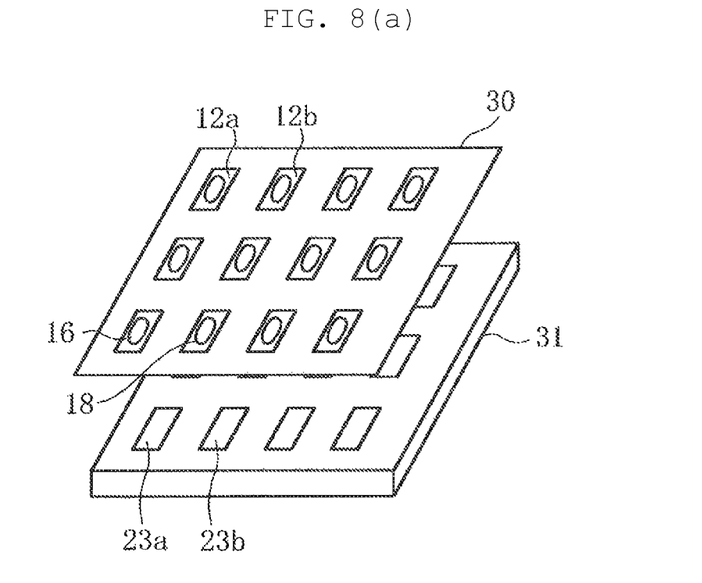

As described above, at step S1, a flexible collective board 30 and a rigid collective board 31 are separately produced as illustrated in FIG. 8(a). For sake of simplicity of description, FIG. 8(a) only illustrates the first and second connection electrodes 12a and 12b and the first and third through-holes 16 and 18 of the flexible collective board 30, and the third and fourth connection electrodes 23a and 23b of the rigid collective board 31.

Figure 8B:
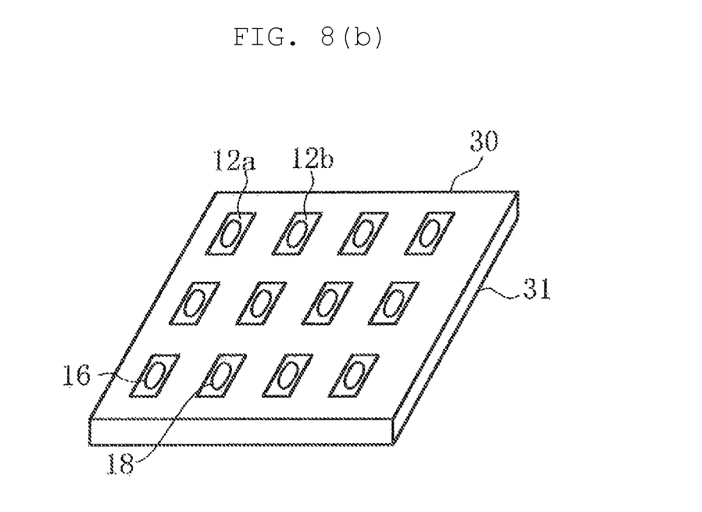

Then at step S2, as illustrated in FIG. 8(b), the flexible collective board 30 is laminated on the rigid collective board 31 and temporarily fixed by using a jig.

Figure 9A:
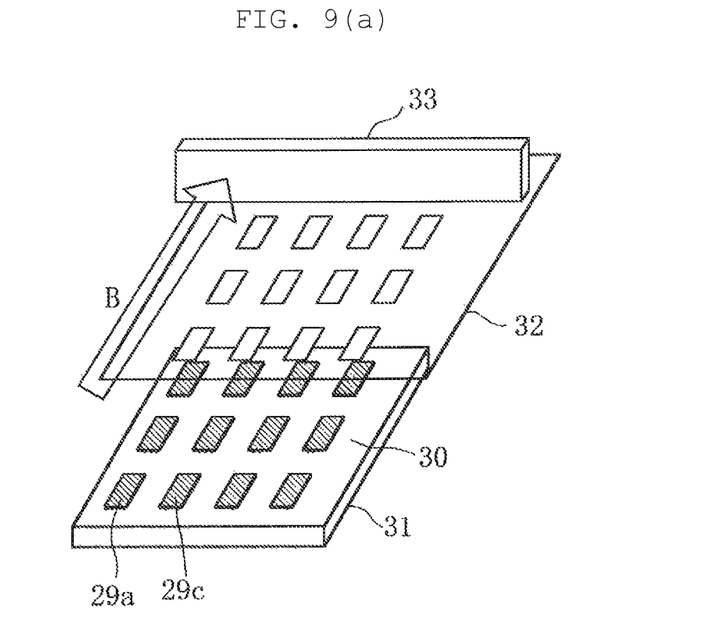

Then at step S3, a squeegee 33 is operated in the direction of arrow B to perform solder screen printing by using a metal mask 32 having a predetermined pattern as illustrated in FIG. 9(a), and fill the first and third through-holes 16 and 18 with the solder 29a and 29c. FIG. 9(a) illustrates an example in which the solder 29a and 29c is applied in the entire range of the first and second connection electrodes 12a and 12b including the first and third through-holes 16 and 18, but the solder 29a and 29c only need to fill at least the first and third through-holes 16 and 18.

In addition, the second through-hole, which is not illustrated in FIG. 9(a), is filled with solder by the screen printing.

Figure 9B:
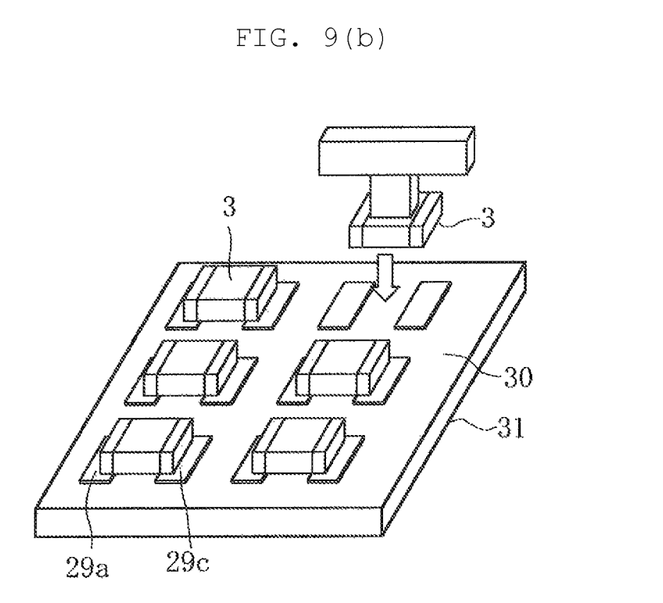
Figure 10A:
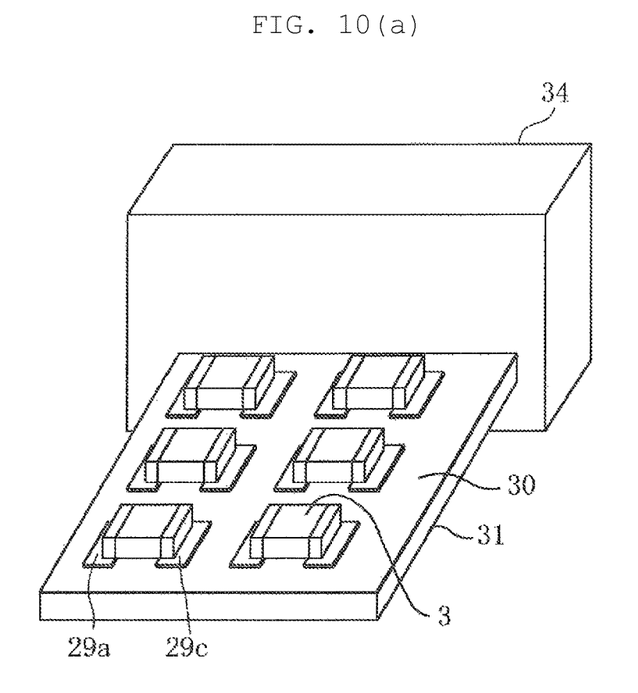

Subsequently at step S4, the electronic component 3 is placed on the flexible collective board 30 as illustrated in FIG. 9(b), and at the following step S5, the electronic component 3 is mounted on the flexible collective board 30 by heating through a reflow furnace 34 as illustrated in FIG. 10(a).

Figure 10B:
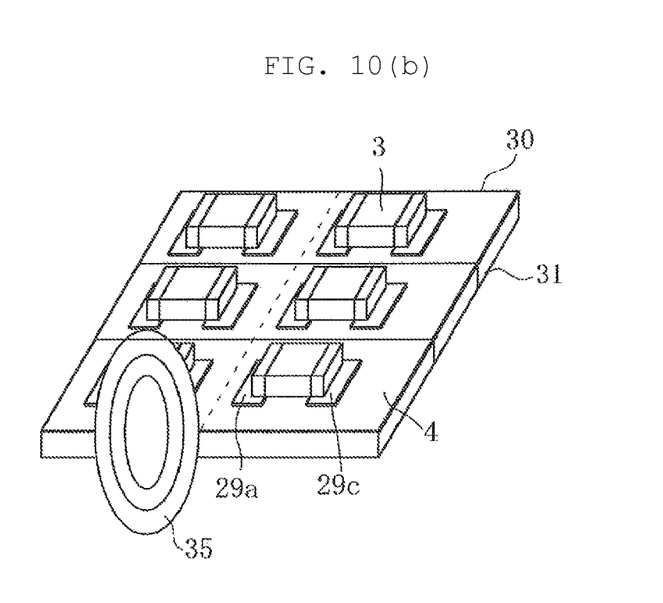

Subsequently, at step 6, the flexible collective board 30 is cut into individual pieces by a cutter 35 such as a dicing saw in longitudinal and transverse directions as illustrated in FIG. 10(b).

Then at step S7, the solder 8a and 8b is applied on the land electrodes 1a and 1b of the wiring substrate 2, and the intermediate connection layer 4 is mounted on the wiring substrate 2 by heating through the reflow furnace again, thereby manufacturing electronic devices.

As described above, in the present manufacturing method, the flexible substrate 10 and the rigid substrate 9 are separately produced and joined together simultaneously with mounting of electronic components. This eliminates the need to produce the intermediate connection layer 4 from an expensive rigid flexible base, which allows manufacturing of an electronic device having a desired fuse function at low cost.

Moreover, since the conductive bond is applied to the through-holes to achieve electric conduction inside the intermediate connection layer through the conductive bond, the occurrence of a breaking defect when a heat load is repeatedly applied in a constant cycle can be suppressed as compared to a case in which a conducting via is produced by plating, which allows manufacturing of an electronic device having favorable reliability.

Specifically, in an electronic device in which the intermediate connection layer 4 is interposed between the electronic component 3 and the wiring substrate 2, electric conduction between the electronic component 3 and the wiring substrate 2 has been typically achieved by a conducting via provided in the intermediate connection layer 4 as disclosed in Patent Document 1. However, such a conducting via has an extremely small hole diameter and is formed by plating, and thus it is difficult to fill the via uniformly and entirely with a metallic material. Accordingly, a breaking defect is likely to occur when a heat load is repeatedly applied in a constant cycle for a long time, which potentially leads to degraded reliability.

In the present manufacturing method, however, since solder is applied to the first to third through-holes 16 to 18 by, for example, screen printing, the first to third through-holes 16 to 18 can have increased hole diameters and can be filled uniformly and entirely with solder at high accuracy, thereby achieving an electronic device that can suppress the occurrence of a breaking defect when a heat load is repeatedly applied in a constant cycle for a long time, and have favorable reliability.

The present invention is not limited to the above-described embodiment, but various kinds of modifications are possible without departing from the scope of the invention. For example, in the above-described embodiment, a pair of the windows 19a and 19b are provided near the fuse part 15, but such windows may not be provided because the fuse part 15 is formed at a position opposite the opening 24 of the rigid substrate 9, which can prevent heat conduction from the fuse part 15 to the rigid substrate 9 at meltdown, and accordingly, a meltdown time can be reduced and firing of the intermediate connection layer 4 can be prevented. Thus, the above-described windows may be omitted.

In the above-described embodiment, solder is used as conductive bond, but any other conductive adhesive agent is applicable.

The following specifically describes an example of the present invention.

Example

A multilayer ceramic capacitor was mounted on an intermediate connection layer, and a heat cycle test was performed.

(Production of Present-Invention Specimen)
[Production of Flexible Substrate]

A polyimide flexible base having a length of 8.4 mm, a width of 6.2 mm, and a thickness of 25 µm, to a surface of which a copper foil having a thickness of 18 µm adhered, was prepared.

Then, a photolithography technique was applied to the flexible base to form first and second connection electrodes each having a length of 4.6 mm and a width of 1.6 mm at predetermined places on the surface of the flexible base. The first connection electrode includes a narrowed fuse part formed between a main conductor part and a sub-conductor part as illustrated in FIG. 3 described above. The fuse part was formed to have a length of 0.9 mm and a width of 0.3 mm.

A pair of windows each having a length of 0.7 mm and a width of 1.2 mm were formed at both side parts of the fuse part through irradiation with laser light.

Subsequently, a plurality of through-holes were drilled inside the first and second connection electrodes by using a drill. Specifically, three through-holes each having a diameter of 1.5 mm were drilled side by side substantially at the center of each of the main conductor part of the first connection electrode and the second connection electrode in a longitudinal direction thereof, and one through-hole having a diameter of 1.0 mm was drilled substantially at the center of the sub-conductor part of the first connection electrode.

Then, at the end, a solder resist was applied and dried at a predetermined place on the surface of the flexible base, which completed the production of the flexible substrate.

[Production of Rigid Substrate]

A rigid base mainly made of glass epoxy resin and having a length of 8.4 mm, a width of 6.2 mm, and a thickness of 0.6 mm, on both principal surfaces of which Cu films were entirely formed, was prepared.

Subsequently, a photolithography technique was applied to the upper and lower surfaces of the rigid base to form third to seventh connection electrodes as illustrated in FIGS. 4 and 5 described above.

Cu films each having a thickness of 35 µm were formed on both side surfaces of the rigid base by plating. Then, an opening having a diameter of 2.0 mm was formed substantially at the center of the rigid base by using a drill.

Then, at the end, a solder resist was applied and dried at a predetermined place on the lower surface of the rigid base, which completed the production of the rigid substrate.

[Mounting of Multilayer Ceramic Capacitor]

The flexible substrate was laminated on the rigid substrate and temporarily fixed by using a jig, and in this state, solder screen printing was performed. Then, solder was applied to the through-holes on the flexible substrate to fill the through-holes with the solder. The solder had a component composition of Sn-3.0Ag-0.5Cu.

Then, a multilayer ceramic capacitor having a length of 5.7 mm, a width of 5.0 mm, and a thickness of 2.0 mm was prepared and placed on the flexible substrate. Then, the flexible substrate, on which the multilayer ceramic capacitor was placed, was passed through a reflow furnace, the temperature in which was adjusted to a temperature with a highest temperature of 245° C., to thermally cure the solder, and accordingly, a present-invention specimen in which the multilayer ceramic capacitor was mounted on the intermediate connection layer was acquired.

(Production of Comparative-Example Specimen)

One through-hole having a hole diameter of 0.3 mm was drilled inside each of the main conductor part of the first connection electrode and the second connection electrode, and one through-hole having a hole diameter of 0.3 mm was drilled inside the sub-conductor part. Then, electrolytic plating was applied to form a conducting via by filling each through-hole with Cu. Except for these differences, the same method and procedure as described above were applied to produce a comparative-example specimen.

[Reliability Evaluation]

A heat cycle test was performed on the present-invention specimen and the comparative-example specimen produced as described above to evaluate the reliability thereof.

Specifically, thirty present-invention specimens and thirty comparative-example specimens were prepared and left first at 150° C. for one hour and then at room temperature for 24 hours.

Then, an equivalent series resistance (ESR) was obtained for each of the thirty present-invention specimens and the thirty comparative-example specimens before and after the heat cycle test.

Specifically, a kelvin contact test fixture (16044A; manufactured by Agilent Technologies) was used, and impedance was measured for a frequency band of 100 Hz to 10 MHz by an impedance analyzer (4194A; manufactured by Agilent Technologies). Minimum values of the measured impedance of the thirty present-invention specimens and the thirty comparative-example specimens were averaged to obtain an initial value X1 of the ESR.

Subsequently, the thirty present-invention specimens and the thirty comparative-example specimens were cooled to −55° C. at a fall speed of 10° C./second, maintained at −55° C. for 30 minutes, and subsequently, heated to +125° C. at a rise speed of 10° C./second, and maintained at +125° C. for 30 minutes, which completes one cycle. The heat cycle test was performed by repeating this cycle 1000 times.

Then, ESRX2 after the heat cycle test was obtained by the same method as described above.

Then, an ESR change rate ΔX was calculated by Expression (1).

$$\Delta X = \{(X2-X1)/X1\} \times 100 \quad (1)$$

As a result, the ESR change rate ΔX was 20% approximately for the comparative-example specimens, but 5% approximately for the present-invention specimens, which is low. This result confirms that an electronic device that can suppress the occurrence of a breaking defect in the intermediate connection layer and have favorable reliability was obtained.

The present invention provides an electronic device that can achieve a desired fuse function having a favorable meltdown characteristic at low cost and have favorable reliability without involving increase in the size of the device.

DESCRIPTION OF REFERENCE SYMBOLS 1a, 1b: land electrode
2: wiring substrate (substrate)

3: electronic component
4: intermediate connection layer
6a, 6b: first and second external electrodes
9: rigid substrate
10: flexible substrate
12: first conductor part
12a, 12b: first and second connection electrodes
15: fuse part
16 to 18: through-hole
19a, 19b: window
23a to 23c: third to fifth connection electrodes
24: opening
25a, 25b: metal film
26: third conductor part
26a, 26b: sixth and seventh connection electrodes
29a to 29c: solder (conductive bond)

The invention claimed is:

1. An electronic device comprising:
a wiring substrate including a land electrode;
an electronic component; and
an intermediate connection layer interposed between the wiring substrate and the electronic component, the intermediate connection layer including:
a first substrate defining an opening therein;
a second substrate, the first substrate being more rigid than the second substrate; and
a first conductor part on a first principal surface of the second substrate, the first conductor part including a fuse part at a position opposite the opening;
second and third conductor parts on respective opposed principal surfaces of the first substrate, wherein
the second substrate and the first substrate are electrically connected with each other via a conductive bond material,
the electronic component and the wiring substrate are electrically connected with each other via the intermediate connection layer, and
the first, second and third conductor parts each include a respective plurality of connection electrodes electrically insulated from each other.

2. The electronic device according to claim 1, wherein the second substrate includes a window adjacent the fuse part.

3. The electronic device according to claim 1, wherein the second substrate includes a through-hole in the first conductor part, the through-hole being filled with the conductive bond material, and the electronic component is joined to the second substrate, and the second substrate is joined to the first substrate.

4. The electronic device according to claim 1, wherein further comprising a metal film on a side surface of the intermediate connection layer.

5. The electronic device according to claim 1, wherein the second substrate comprises a thermally resistant resin material.

6. The electronic device according to claim 1, wherein the second substrate is thinner than the first substrate.

7. The electronic device according to claim 1, wherein the conductive bond material is a soldering material.

8. The electronic device according to claim 1, wherein the electronic component is disposed opposite the second substrate.

9. An electronic-device manufacturing method, the method comprising:
preparing a first substrate and a second substrate, the first substrate being more rigid than the second substrate;
forming a first conductive part including a fuse part on a principal surface of the second substrate;
forming a through-hole inside the first conductive part;
forming second and third conductive parts on respective opposed principal surfaces of the first substrate;
forming an opening in the first substrate;
laminating the second substrate and the first substrate so that the fuse part is disposed opposite the opening;
applying a conductive bond material in the through-hole; and
joining an electronic component to the second substrate and simultaneously joining the second substrate to the first substrate by heating,
wherein the formed first, second and third conductive parts each include a respective plurality of connection electrodes electrically insulated from each other.

10. The electronic-device manufacturing method according to claim 9, wherein the conductive bond material is applied in the through-hole by a printing method.

11. The electronic-device manufacturing method according to claim 9, wherein the second substrate and the first substrate thus joined forms an intermediate connection layer, the method further comprising mounting the intermediate connection on a wiring substrate by heating the conductive bond material.

12. The electronic-device manufacturing method according to claim 9, forming a window in the second substrate adjacent the fuse part.

13. The electronic-device manufacturing method according to claim 9, further comprising forming a metal film on a side surface of the first base.

14. The electronic-device manufacturing method according to claim 9, wherein the conductive bond material is a soldering material.

* * * * *